United States Patent [19]
Seki et al.

[11] Patent Number: 6,084,356
[45] Date of Patent: Jul. 4, 2000

[54] PLASMA PROCESSING APPARATUS WITH A DIELECTRIC BODY IN THE WAVEGUIDE

[75] Inventors: Hirofumi Seki; Satoshi Ichimura, both of Hitachi; Satoshi Takemori, Hitachioota; Eiji Setoyama; Kouji Ishiguro, both of Hitachi; Yasuhiro Mochizuki; Sensuke Okada, both of Hitachinaka; Hajime Murakami, Tomobe-machi, all of Japan

[73] Assignee: Hitachi, Ltd., Tokyo, Japan

[21] Appl. No.: 09/084,911

[22] Filed: May 28, 1998

[30] Foreign Application Priority Data

Jun. 3, 1997 [JP] Japan ................................. 9-144896

[51] Int. Cl.$^7$ ...................................... H05H 1/46
[52] U.S. Cl. ........................... 315/111.41; 315/111.71; 313/231.31; 156/345; 118/723 MA
[58] Field of Search ..................... 315/111.21, 111.41, 315/111.71; 313/231.31; 156/345 MW, 345 ME; 118/723 MR, 723 MA

[56] References Cited

U.S. PATENT DOCUMENTS

| | | | |
|---|---|---|---|
| 5,279,669 | 1/1994 | Lee | 156/345 ME X |
| 5,620,522 | 4/1997 | Ichimura et al. | 118/723 MR |
| 5,824,606 | 10/1998 | Dible et al. | 156/345 X |

FOREIGN PATENT DOCUMENTS

| | | | |
|---|---|---|---|
| 5-347196 | 12/1993 | Japan | 315/111.41 |
| 8-102279 | 4/1996 | Japan . | |

*Primary Examiner*—Justin P. Bettendorf
*Attorney, Agent, or Firm*—Beall Law Offices

[57] ABSTRACT

Dielectric bodies are arranged in waveguide portions for passing microwave radiation and for holding a plasma generating chamber 25 at a vacuum. The dielectric bodies are arranged to intersect at least an electron cyclotron resonance area of the waveguide portions. A tip end portion of the dielectric bodies at a side of the plasma generating chamber are positioned toward at a side of the plasma generating chamber from an intermediate portion in an axial direction length of a first permanent magnet which is arranged by enclosing an outer periphery of the waveguide portions, and a tip end portion of the dielectric bodies at a side of the plasma generating chamber is substantially consistent with an inner face of the plasma generating chamber.

9 Claims, 6 Drawing Sheets

PLASMA PROCESSING APPARATUS WITH A DIELECTRIC BODY IN THE WAVEGUIDE

BACKGROUND OF THE INVENTION

The present invention relates to a plasma processing apparatus and in particular relates to a plasma processing apparatus suitable for use in a plasma etching in the manufacture of a semiconductor device etc., and an apparatus in which a thin film is generated by using a plasma such as a plasma CVD (Chemical Vapor Deposition) etc.

As a conventional plasma processing apparatus, a technique is disclosed in Japanese patent laid-open publication No. Hei 8-102,279. This publication describes a small-sized permanent magnet and a homogeneous plasma extending to a wide range in a plasma generating chamber and also a high density plasma. The conventional plasma processing apparatus comprises a waveguide portion for introducing microwave energy, an electron heating space chamber portion formed in a position of a downstream side of a dielectric body in the waveguide portion, and a plasma generating chamber connected to the electron heating space chamber portion. A first magnetic field generating means surrounds an outer periphery of the electron heating space chamber portion, forms a strong magnetic field which exceeds an electron cyclotron resonance magnetic field strength in a microwave lead-through portion of the dielectric body along a transmission direction of the microwave energy, and forms a cup-shaped magnetic field in which a direction is reversed against the magnetic field following a direction of a plasma generating chamber from a boundary portion between the electron heating space chamber portion and the plasma generating chamber, whereby a magnetic field abruptly decreases at the boundary portion between the electron heating space chamber portion and the plasma generating chamber from the microwave lead-through portion of the dielectric body. A second magnetic field generating means comprises permanent magnets which are arranged by alternating the order of their polarities at a surrounding portion of the plasma generating chamber.

However, since the electron heating space chamber portion is formed in the waveguide portion, in a case where a pressure in an enclosed vessel (the plasma generating chamber) becomes more than 1 mTorr, the diffusion of the electrons from the electron heating space portion is difficult. Therefore, there is a problem that it is impossible to make the plasma density of the plasma generating chamber large.

SUMMARY OF THE INVENTION

The present invention is devised under the consideration of the above stated problems. A first object according to the present invention is to provide a plasma processing apparatus wherein a high density plasma can be generated easily.

Further, a second object according to the present invention is to provide a plasma processing apparatus wherein in addition to the first object, a high speed cleaning can be attained and a high throughput can be carried out.

According to the present invention, to attain the above stated first object, a dielectric body is arranged in a waveguide portion and to pass through microwaves and to hold a plasma generating chamber at a vacuum atmosphere. This dielectric body is arranged to intersect at least an electron cyclotron resonance area of the waveguide portion, a tip end portion of the dielectric body at a side of the plasma generating chamber is positioned toward a side of the plasma generating chamber from an intermediate portion in an axial direction length of a first permanent magnet which is arranged by surrounding outer periphery of the waveguide portion, or a tip end portion of the dielectric body at a side of the plasma generating chamber is substantially consistent with an inner face of the plasma generating chamber.

Further, to attain the above stated second object, in addition to the above stated construction, means for applying a high frequency voltage is provided to a processing subject in which an etching or a thin film is formed according to a plasma, and also means for applying a high frequency voltage to an upper wall which serves as one portion of the plasma generating chamber is provided to the processing subject. Further, means for applying a phase to both the above stated high frequency applying means is provided.

According to the present invention, when the microwave radiation is supplied to the waveguide portion, the high energy electrons are generated locally at a magnetic field which is higher than the electron cyclotron resonance magnetic field, and the generated high energy electrons diffuse easily in the plasma generating chamber.

In this case, when the gas pressure is raised to the degree of 10 mTorr, the high energy plasma is not confined to the waveguide portion but diffuses in the plasma generating chamber. As a result, the high density plasma can be generated easily in the plasma generating chamber.

Further, in the above stated first permanent magnet, since the magnetic field gradient at the vicinity of the electron cyclotron resonance magnetic field strength is abrupt, even the magnetic field strength at which the microwave radiation is absorbed easily fluctuates according to the condition of the plasma, and the space fluctuation at the microwave absorption position can be restrained fully in comparison with the microwave wavelength.

Accordingly, the unstable factors relating to the propagation and the absorption of the microwave radiation can be lessened extremely and the high electric field microwave radiation can be supplied surely and stably to the electron cyclotron resonance strength area. Further, in the electron cyclotron resonance strength area, almost all of the microwave energy is absorbed by the electrons and the high energy electrons can be obtained.

In the above case, since the first permanent magnetic forms of the cusp shaped magnetic field in which the magnetic field direction becomes reversibly at a downstream side from a boundary portion between the electron cyclotron resonance magnetic field strength area and a plasma generating chamber portion, the electrons near to an axial center of the electron cyclotron resonance magnetic field strength area can easily diffuse to the plasma generating chamber portion.

In addition to the above, the magnetic field according to the permanent magnet is abruptly attenuated weak in a case where the distance is remote, a wide area of the plasma generating chamber portion is made the weak magnetic field area in which the high energy electrons for burdening an ionization can move around.

The high energy electrons which are diffused in the plasma generating chamber portion collide with the neutral particles while they move around the weak magnetic field in the plasma generating chamber portion and make the ionization, and accordingly the homogeneous plasma extending over the wide range can be generated.

Further, at the surrounding portion of the plasma generating chamber portion, the plural second permanent magnets are arranged to form reversibly the magnetic poles of the permanent magnets which are arranged adjacent to each other and the multi-pole cusp magnetic field is formed. Not only the diffused high energy electrons, but also the plasma which is generated by the above high energy electrons, can be confined effectively, and accordingly the high density plasma can be formed in the plasma generating chamber portion.

The plasma generated at the weak magnetic field area is almost not affected by the magnetic field, the distribution of ions is uniform, and also a good property can be obtained when the ion temperature is low. Further, the distribution of the radicals which are generated at the weak magnetic field area accompanied with the plasma becomes homogeneous.

Further, since the high frequency is applied to the processing subject (the substrate), the upper wall and the side wall, and also the phase of the high frequency which is applied to the respective component is controlled, the discharge between the substrate and the upper wall, the discharge between the substrate and the side wall, and the discharge between the upper wall and the side wall are controlled, the adhesion matters extending over the whole inner wall can be sputtered and the inner face of the vessel (the plasma generating chamber) can be cleaned at high speed.

DETAILED DESCRIPTION OF THE INVENTION

Hereinafter, a plasma processing apparatus according to the present invention will be explained in detail in accordance with illustrated embodiments. FIG. 1 to FIG. 4 show a first embodiment of a plasma processing apparatus according to the present invention.

Figure 1:
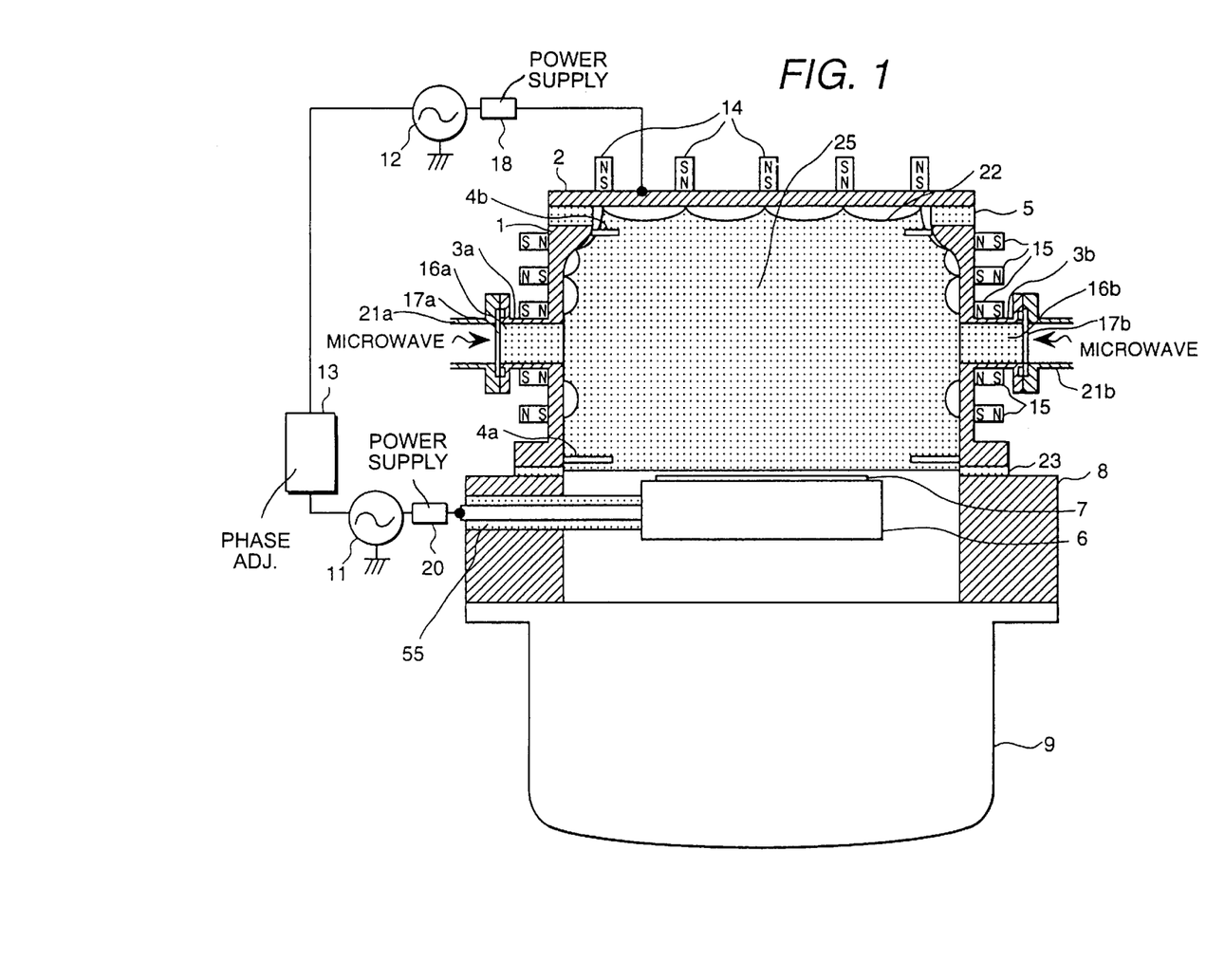
FIG. 1 is a cross-sectional view showing one embodiment of a plasma processing apparatus according to the present invention.

Reference numeral 25 denotes a plasma generating chamber which is formed with a substantially cylindrical shape.

The plasma generating chamber 25 is comprised of a side wall, an upper wall 2, waveguide portions 3a and 3b, gas inlet ports 4a and 4b, and an insulating plate 5.

To the side wall 1, the waveguide portions 3a and 3b for introducing microwave radiation are formed integrally. In FIG. 1, there are two inlet ports of the microwaves, but one inlet port and more than three introductions can be provided. To the waveguide portions 3a and 3b, outside portion waveguide portions 21a and 21b are connected. Between boundary portions of both waveguide portions 3a and 3b and outside portion waveguide portions 21a and 21b, quartz windows 17a and 17b, through which the microwave radiation passes, and for shielding a vacuum, are provided.

Further, in the plasma generating chamber 25, a substrate holder 6 for holding a substrate 7 (a processing subject) is provided at a position which is arranged oppositely against the upper wall 2, and the above stated waveguide portions 3a and 3b are provided to introduce the microwave radiation into the plasma generating chamber 25, substantially parallel to a face of the substrate 7.

Further, the plasma generating chamber 25 is installed on a base plate 8 through another insulating plate 23, and a vacuum evacuation is carried out through a vacuum evacuation apparatus 9 which is provided at a lower side of the base plate 8. Not shown in FIG. 1, the substrate 7 is carried-in or carried-out by a transporting robot from another chamber.

The upper wall 2 and the substrate holder 6 are insulated electrically from the base plate 8 which forms a standard voltage, and to the upper wall 2 and the substrate holder 6 high frequency power supplies 11 and 12 for applying respectively a high frequency voltage and a phase adjusting means 13 for adjusting a phase are provided. Reference numerals 18 and 20 denote direct current power supplies, a reference numeral 22 denotes a cusp magnetic field, and a reference numeral 55 denotes a further insulating member.

A raw material gas is introduced into the plasma generating chamber 25 from the gas inlet ports 4a and 4b which are provided in the side wall 1, however this gas inlet port may be provided on the upper wall 2.

Figure 3:
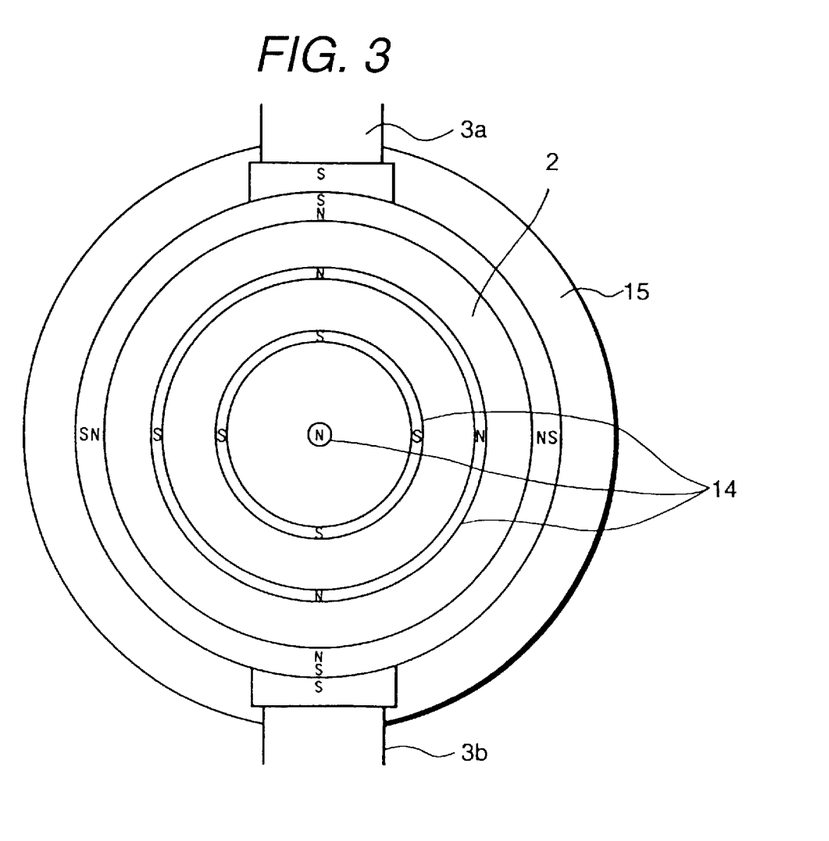
FIG. 3 is a plan view showing the plasma processing apparatus shown in FIG. 1.

As shown in FIG. 3, on the circular plate like upper wall 2, permanent magnets 14 are arranged in concentric circles by varying polarities in order to form the cusp magnetic field 22. In FIG. 3, ring like permanent magnets 14 are arranged in concentric circles, however in a case of an arrangement for forming a linear like cusp magnetic field, they are not always arranged in concentric circles.

Figure 2:
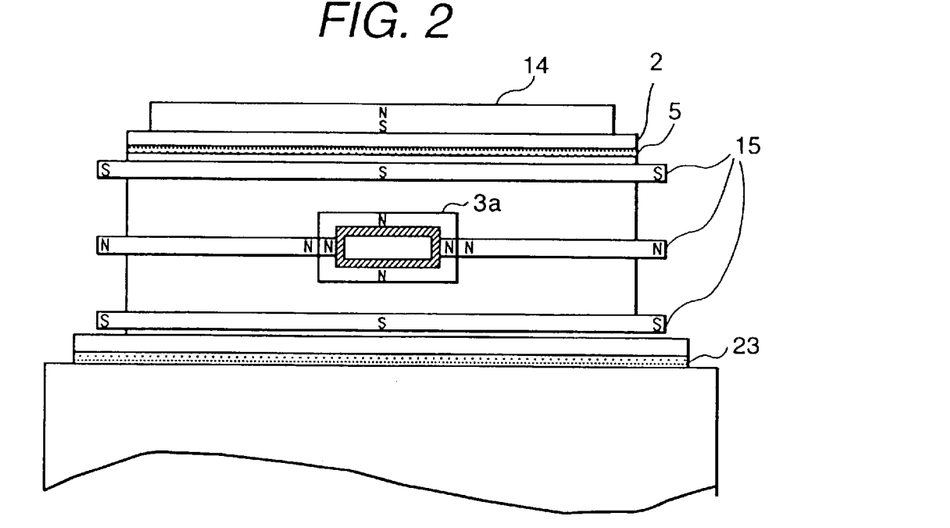
FIG. 2 is a front view showing the plasma processing apparatus shown in FIG. 1.

On the other hand, at a periphery of the side wall 1 of the plasma generating chamber 25, plural permanent magnets 15 for forming the cusp magnetic field 22 by varying this polarities are provided. However, as shown in FIG. 2, at a periphery of the waveguide portions 3a and 3b which are connected to the side wall 1, by making the polarities of the permanent magnets 15 the same, as stated in a latter portion, an electrode cyclotron resonance area for generating a high density plasma is formed locally. The materials of the plasma generating chamber 25 and the base plate 8 are aluminum, and although not shown in the figure, a wall temperature of the plasma generating chamber 25 is adjusted at constant using a heater member and a water cooled member, etc.

In this embodiment according to the present invention, in the interior portions of the waveguide portions 3a and 3b, dielectric bodies 16a and 16b for passing the microwave radiation and for shielding the vacuum atmosphere are provided respectively. Tip end portions of the dielectric bodies 16a and 16b at a side of the plasma generating chamber 25 are installed to be substantially consistent with an inner face of the plasma generating chamber 25. It is preferable to make the tip end portions of the dielectric bodies 16a and 16b at the side of the plasma generating chamber 25 substantially consistent with a curvature of the inner face of the plasma generating chamber 25.

Further, the permanent magnets 15 are comprised of samarium, cobalt etc. having a large residual magnetic flux density (about 11,000 Gauss) and, as shown in FIG. 2, the permanent magnets 15 are arranged to enclose peripheries of the waveguide portions 3a and 3b. Further, the permanent magnets 15 are provided along the axial direction lengths of the dielectric bodies 16a and 16b and, as shown in FIG. 4(a), the permanent magnets 15 form a magnetic field which is provided along to the transmission direction of the microwave.

In this case, as shown in FIG. 4(a) and FIG. 4(c), in the microwave lead-through portions of the dielectric bodies 16a and 16b, the magnetic field becomes a large magnetic field (in this embodiment, about 950 Gauss) which exceeds the strength (about 875 Gauss) of the electron cyclotron resonance magnetic field. Further, from this point the magnetic field is weakened abruptly toward the downstream and the magnetic field becomes 0 (zero) at a point 114, and further at a side more downstream for reaching to the plasma generating chamber 25, the cusp magnetic field 22 where the orientation of the magnetic field becomes reversible is formed.

In a case where the microwave radiation is incident to the plasma generating chamber 25 through the waveguide portions 3a and 3b, mainly the electrons are generated locally and heated at the strong magnetic field area which is stronger than the electron cyclotron resonance magnetic field of end faces of the dielectric bodies 16a and 16b. As a result, the plasma is generated due to the collision of the electrons and the gas and the generated plasma is diffused to the plasma generating chamber 25 along the magnetic lines of force. For example, in a case where the frequency of the microwave radiation is 2.45 GHz, the strength of the magnetic field of the electron cyclotron resonance is 875 Gauss. A bold line indicates a curve of an equal-magnetic flux density of 875 Gauss.

As understood from FIG. 4(a), a constricted part 112c of the electron cyclotron resonance area 112 exists in the dielectric bodies 16a and 16b, during the microwave incidence, and the plasma does not generate in the dielectric bodies 16a and 16b.

However, a large number of high energy electrons are generated at parts 121a and 121b at vicinities of the tip end portions of the dielectric bodies 16 and 16b which are consistent with the inner face of the plasma generating chamber 25, and also generated electrons diffuse into the plasma generating chamber 25 and accordingly the high density plasma is generated.

Figure 5:
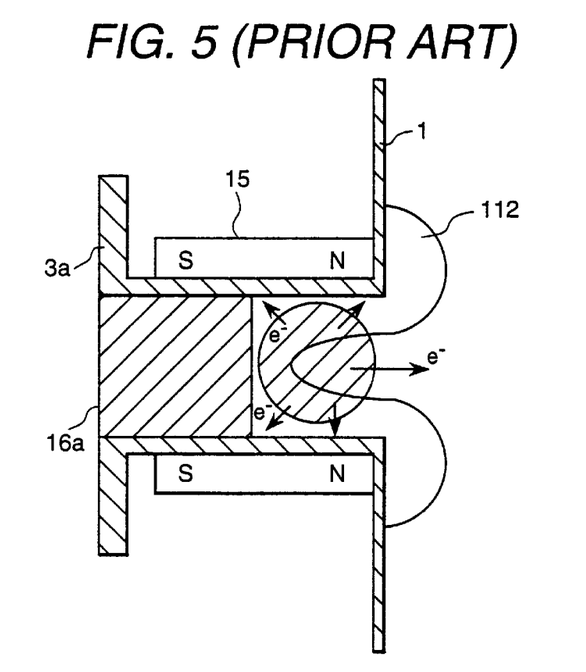
FIG. 5 is a characteristic view showing a microwave waveguide portion in a plasma processing apparatus according to the prior art.

FIG. 5 is a cross-section showing the microwave inlet port portion in the above stated plasma processing apparatus according to the prior art. As clearly shown in this figure, since most of the electron cyclotron resonance area is provided in a space chamber which is formed in a waveguide portion connected to a plasma generating chamber, when the microwaves are introduced, a large amount of the plasma is generated in the waveguide portion.

Accordingly, in a case where the gas pressure is large, since the diffusion of the electrons into a central portion of the plasma generating chamber 25 is prevented, almost all electrons are absorbed in a tube wall. As a result, in the case of FIG. 5 the gas pressure is made large; it is understood that a loss of the plasma to the tube wall increases.

Figure 4:
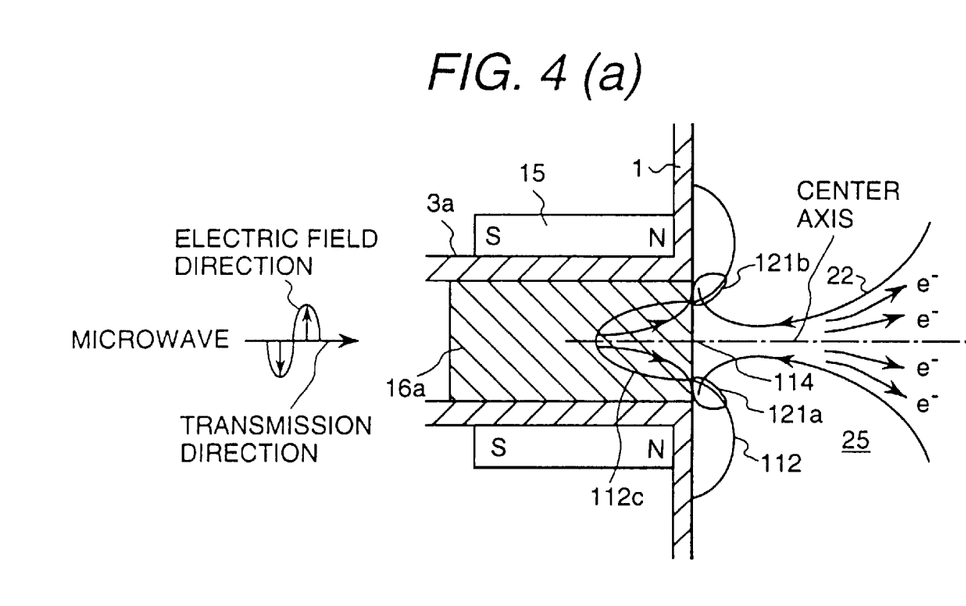
FIG. 4(a) is an enlarged view showing a microwave waveguide portion in the plasma processing apparatus according to the present invention.
FIG. 4(b) is a characteristic view showing a current amount of an electron in a height direction position of a plasma generating chamber.
FIG. 4(c) is a characteristic view showing a magnetic field strength on a center axis of the waveguide portion.
Figure 6:
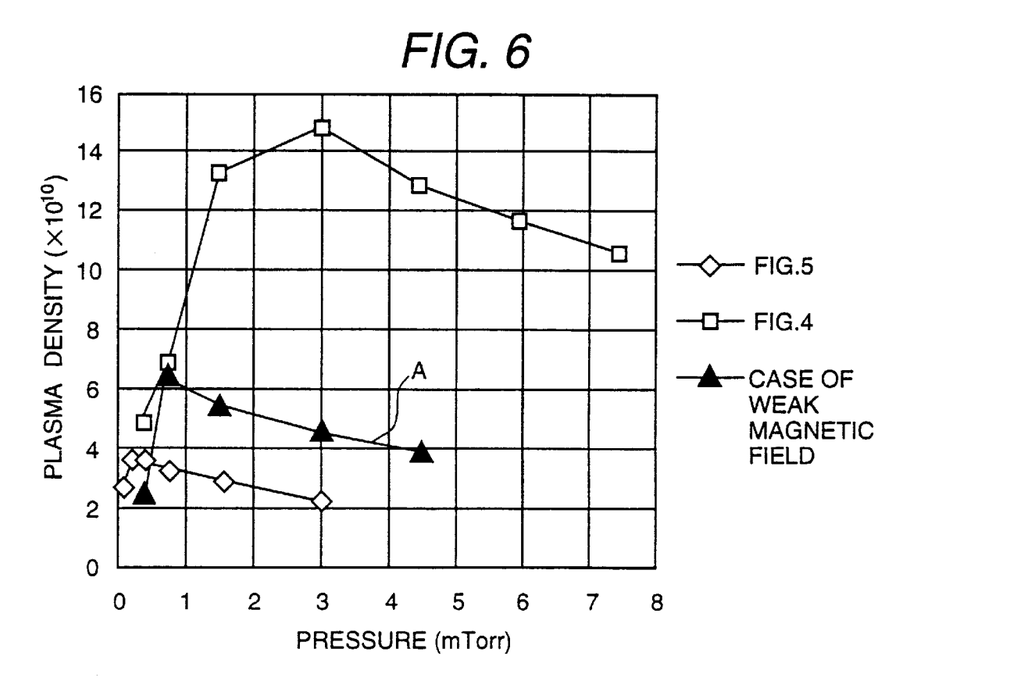
FIG. 6 is a characteristic view showing a pressure dependency characteristic of a density of a generated plasma.

In the case of this embodiment according to the present invention shown in FIG. 4 and in the case according to the prior art shown in FIG. 5, an example for comparing a gas pressure dependency characteristic of the density of the plasma on the substrate 7, where the incident power of the microwaves is constant, is shown in FIG. 6.

As understood from this figure, in the case of FIG. 5 according to the prior art, when the pressure is less than $3 \times 10^{-4}$ Torr, the density of the plasma shows a maximum value of $4 \times 10^{10}/cm^3$. On the contrary to this, in the case of FIG. 4 according to the present invention, the density of the plasma as a maximum value when the pressure is of the degree of 3 mTorr, and further an absolute value of the density of the plasma is $1.5 \times 10^{11}/cm^3$. This value is larger by one figure than the case of FIG. 5 according to the prior art.

For example, in a high density plasma CVD (Chemical Vapor Deposition) for forming a layer insulating film for use in a multi-layer wiring of a super LSI, it is necessary to have the density of the plasma be more than $1 \times 10^{11}$ pieces/$cm^3$, and further the gas pressure is several mTorr. As a result, in an orientation shown in FIG. 5 according to the prior art, it is impossible to process essentially the substrate 7.

On the contrary to the above, in this embodiment according to the present invention using a simple means in which the tip end portion of the dielectric body 16a or 16b at the side of the plasma generating chamber 25 is substantially consistent with the inner face of the plasma generating chamber 25 and the constricted part of the electron cyclotron area is cut from the dielectric body 16a or 16b, as a result the scattering of the plasma to the wall of the plasma generating chamber 25 can be prevented and therefore the high density plasma can be generated extremely effectively.

In particularly, to pour the heating electrons into the plasma generating chamber 25 along the magnetic lines of force from the electron cyclotron resonance magnetic field areas 121a and 121b, the difference between the positions of the end faces of the dielectric bodies 16a and 16b and the position of the inner wall face of the plasma generating chamber 25 along the proceeding direction of the plasma is substantially eliminated and then the apparatus is arranged with the above structure. As a result, the above stated essential factors can be satisfied. Since the generated plasma is shut up or confined in the area where the magnetic field strength is extremely small, for example, in an argon and silane atmosphere, a large diameter and homogeneous plasma can be generated.

Further, as other structures for satisfying the above stated essential factors, the dielectric bodies 16a and 16b can be arranged to intersect with the electron cyclotron resonance area in the waveguide portions 3a and 3b, and the tip end portions of the dielectric bodies 16a and 16b at the side of the plasma generating chamber 25 can be positioned toward a side of the plasma generating chamber 25 from an intermediate portion of a length of the axial direction of the permanent magnets 15 which are arranged by enclosing the outer periphery of the waveguide portions 3a and 3b.

Further, in addition to the above structures, for example, at one portion of the waveguide portions 3a and 3b, a member comprised of a thin dielectric body can be adhered closely to the waveguide portions 3a and 3b and then the vacuum in the plasma generating chamber 25 can be held. In this case, since a side of the microwave approach in the waveguide portions 3a and 3b which is comprised of the dielectric body can be held at an atmospheric pressure, during the microwave incidence, the plasma is generated at the side of the microwave approach in the waveguide portions 3a and 3b which is comprised of the dielectric body. In the structures stated above, since scattering of the energy in the waveguide portions 3a and 3b can be prevented, a high density plasma can be generated easily in the plasma generating chamber 25.

The gas pressure dependency characteristic of the plasma density according to the present invention is affected largely by the size or the largeness of the electron cyclotron resonance area. For example, when using the weak force magnet the electron cyclotron area is made small, as shown at A in FIG. 6, the plasma density decreases, and further when the gas pressure is small, the maximum value of the electron density can be obtained.

On the contrary to the above, using the strong force magnet the electron cyclotron area is enlarged and a large plasma density can be obtained. However, the magnetic field on the substrate becomes large, and as a result, device damage, etc., occurs. Accordingly, by strengthening locally the magnetic field of the vicinity of the magnet, it is important to not make strong the magnetic field at a remote portion of the vicinity of the substrate 7.

Figure 7:
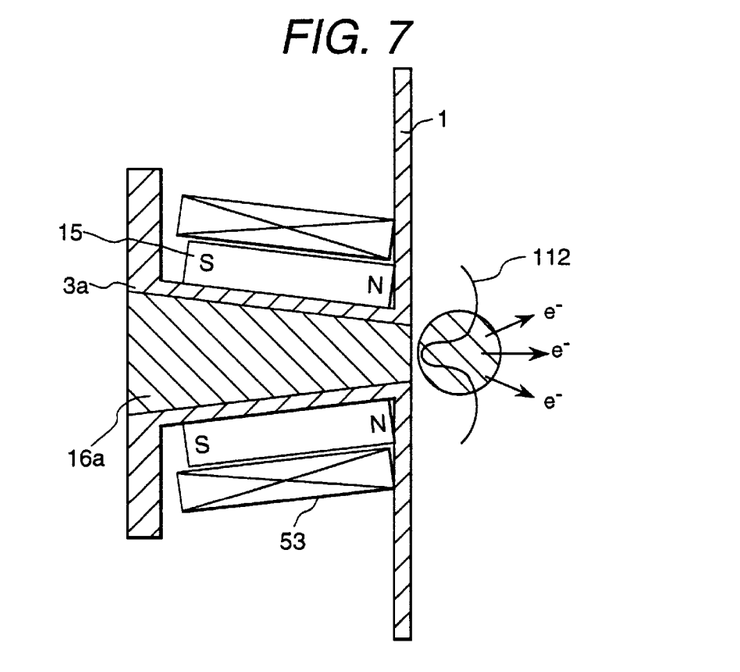
FIG. 7 is a cross-sectional view showing a microwave waveguide portion of another embodiment of a plasma processing apparatus according to the present invention.

So as to carry out the above facts, for example, as shown in FIG. 7, the waveguide portion 3a is formed with a taper shape which inclines to be gradually narrow along the proceeding direction of the microwave. Further, in the interior portion of the waveguide portion 3a the dielectric body 16a is arranged and the permanent magnet 15 is arranged along the outer periphery of the inclined waveguide portion 3a. Also, a coil is formed by providing a winding wire 53 at a surrounding portion of the permanent magnet 15. As a result, by strengthening the electron cyclotron resonance magnetic field area, the plasma can be drowned out in the plasma generating chamber 25. Accordingly, the high density plasma can be generated more easily.

One of the important points according to the present invention relates to the cleaning of the inner wall of the plasma generating chamber 25. When the substrate 7 is processed, foreign matter attaches to the inner wall of the plasma generating chamber 25. The high speed removal of the foreign matter is an important factor for improving the through-put of the plasma processing apparatus.

In this embodiment according to the present invention, as shown in FIG. 1, to the substrate holder 6 and the upper wall 2, for example, the high frequency power supplies 11 and 12 are provided, and they apply respective high frequency voltages having a frequency of 13.56 MHz. Further, the phase adjusting means 13 is provided to control the phases of the respective high frequency voltages.

Accordingly, since the discharge between the substrate 7 and the upper wall 2, the discharge between the substrate 7 and the side wall 1, and the discharge between the upper wall 2 and the side wall 1 can be controlled, the adhesion matters extending over the whole inner wall of the plasma generating chamber 25 can be sputtered and thereby the cleaning about the inner wall of the vessel (the plasma generating chamber 25) can be carried out at a high speed.

Figure 8:
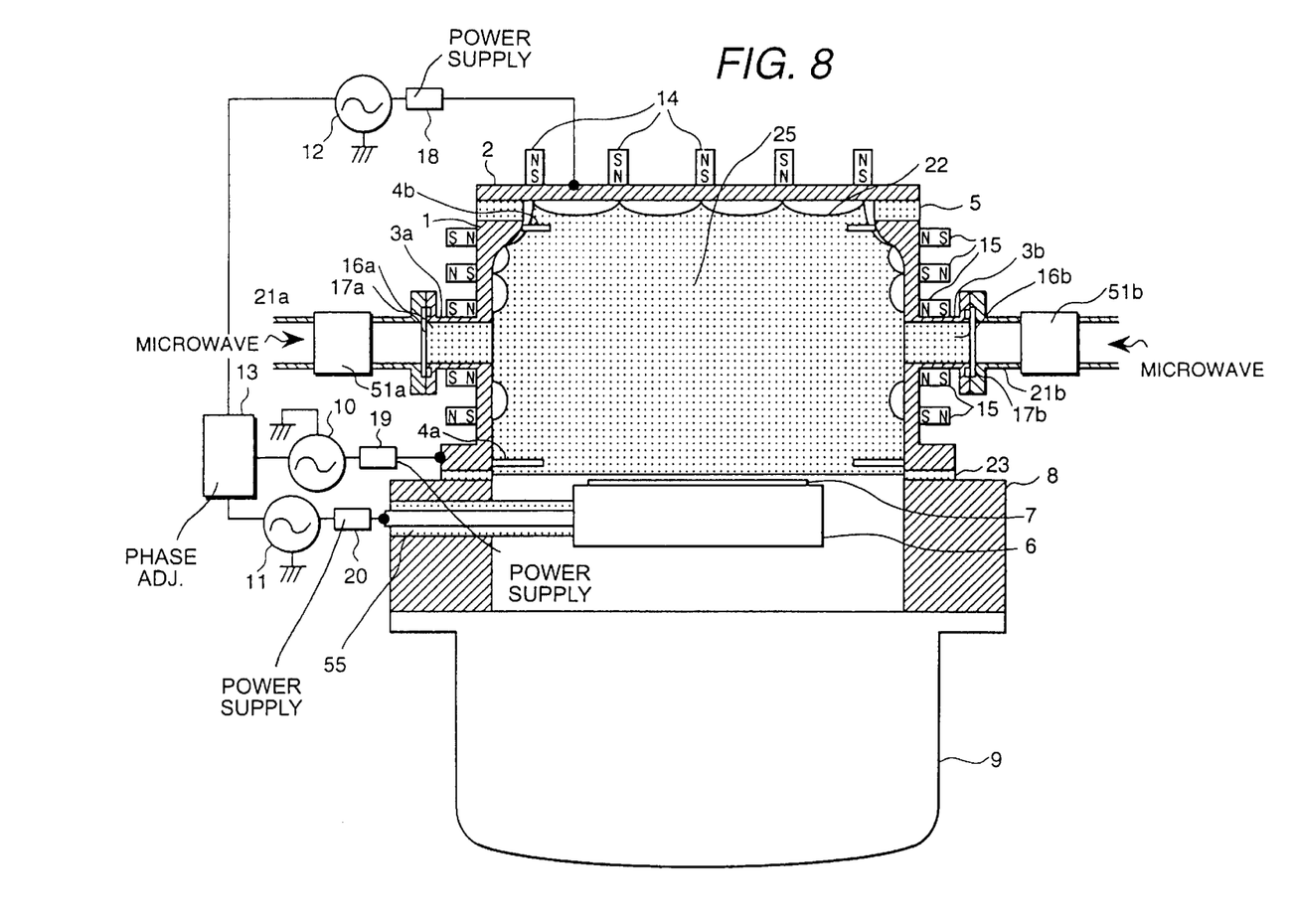
FIG. 8 is a cross-sectional view showing a further embodiment of a plasma processing apparatus according to the present invention.

Another embodiment of a plasma processing apparatus in which the present invention is applied is shown in FIG. 8. The structure shown in FIG. 8 is substantially the same as the structure shown in FIG. 1, however the following structures are different. Namely, the side wall 1 is insulated electrically from the base plate 8 through an insulating member 23, and further to the side wall 1 the high frequency power supply 10 for applying the high frequency voltage to the side wall 1 and a phase adjusting means 13 are provided. This phase adjusting means 13 changes the phase difference for applying the high frequency voltage to the side wall 1 and the upper wall 2 and the phase difference for applying the high frequency voltage to the side wall 1 and the substrate 7. Further, high frequency shielding elements 51a and 51b are provided, which shield the high frequency voltage to the microwave inlet port portion of the side wall 1.

Figure 9:
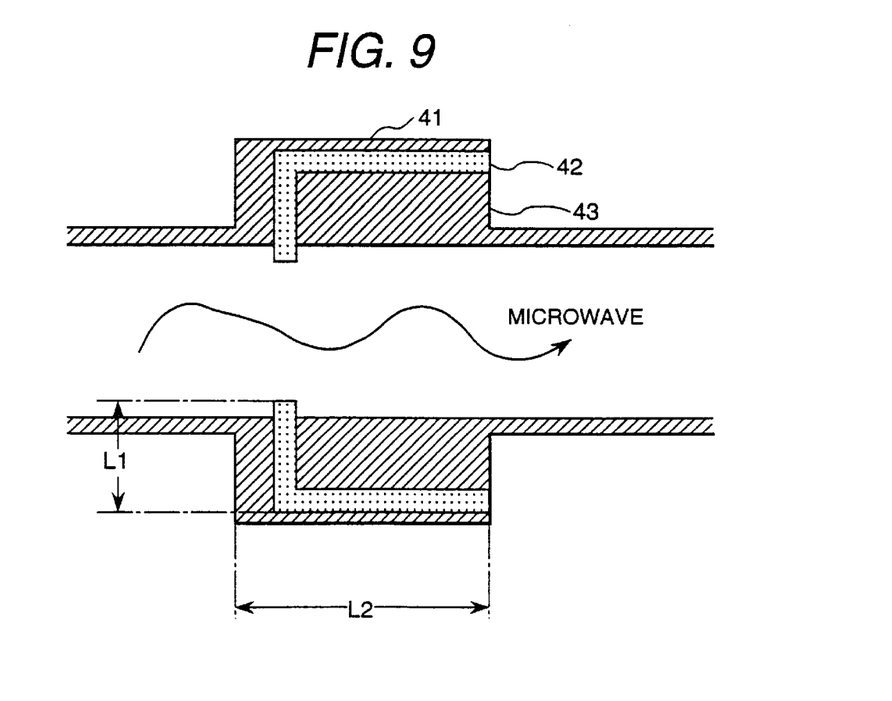
FIG. 9 is a cross-sectional view showing a constitution of a high frequency cut element which is adopted in the plasma processing apparatus according to the present invention shown in FIG. 8.

In the high frequency shielding elements 51a and 51b for shielding the high frequency voltage to the microwave inlet port portion of the side wall 1, two wave guide portions 41 and 43 are connected through a thin insulating member 42, for example as shown in FIG. 9. As a result the leakage of the microwave can be prevented and also the high frequency of 13.56 MHz can be insulated.

In particular, in FIG. 9, since the lengths L1 and L2 of the insulating member 42 are ¼ of the wavelength of the microwaves, a choke structure can be constituted, the loss of the microwave radiation can be maintained small, and the high frequency can be shielded.

With the above stated structure, in particular, the adhesion matters of the surface of the side wall 1 of the plasma generating chamber 25 can be cleaned at a high speed according to the sputtering discharge of the surface of the side wall 1 of the plasma generating chamber 25.

Without a treatment or a provision of the magnet, one method for maximizing the electron cyclotron area in the plasma generating chamber 25 is to make the end faces of the dielectric bodies 16a and 16b in the waveguide portions 3a and 3b to have a similar curvature as that of the inner wall of the plasma generating chamber 25. For example, in a case where the plasma generating chamber 25 is formed with a cylindrical like shape, the ends of the dielectric bodies 16a and 16b may be formed with a curvature of a similar cylindrical like shape.

Further, in the processing for forming the film of the insulating member on the surface of the substrate, by installing the insulating member on the surface of the upper wall or by covering the surface by the insulating member, it is possible to make the film formation of the insulating member on the surface of the substrate by sputtering the insulating member according to the application of the high frequency voltage.

According to this embodiment of the present invention variously stated in above, by the provision of the comparative simple means in which the position of the end face of the dielectric body which is provided in the waveguide portion is arranged to be substantially consistent with the position of the inner wall face of the above stated plasma generating chamber toward the proceeding direction of the microwave, the high density plasma can be generated easily in the plasma generating chamber.

Further, since the plasma is enclosed or confined in the area having the small magnetic field strength by the cusp magnetic field, a homogenous, large diameter, and high density plasma can be generated.

Further, by regulating the size and the arrangement of the magnet, an effective, large diameter, and high density plasma power supply can be constituted. Further, since the plasma processing apparatus has means for applying independently the high frequency voltage to the side wall, the upper wall and the substrate, cleaning of the inner face of the plasma generating chamber can be carried out at high speed. Accordingly, by applying the invention to plasma CVD (Chemical Vapor Deposition) and etching, an economically superior plasma processing apparatus can be provided.

As stated above, in the plasma processing apparatus according to the present invention, a dielectric body is arranged in a waveguide portion for passing microwave radiation and for holding a plasma generating chamber at a vacuum. The dielectric body is arranged to intersect with at least an electron cyclotron resonance area of the waveguide portion, a tip end portion of the dielectric body at a side of the plasma generating chamber being positioned toward a side of the plasma generating chamber from an intermediate portion in an axial direction length of a first permanent magnet which is arranged by surrounding an outer periphery of the waveguide portion. The tip end portion of the dielectric body at a side of the plasma generating chamber is substantially consistent with an inner face of the plasma generating chamber. In a case where the microwave radiation is supplied to the waveguide portion, since the high energy electrons are generated mainly in the area which has a higher magnetic field than the electron cyclotron resonance magnetic field in the plasma generating chamber, and the generated high energy electrons are diffused easily to the plasma generating chamber, a high density plasma can be generated easily in the plasma generating chamber.

Further, in addition to the above stated construction, means for applying a high frequency voltage is provided to the processing subject, in which an etching or a thin film is formed by a plasma, and also means for applying a high frequency voltage to the upper wall which serves as one portion of the plasma generating chamber is provided. Further, means for applying a phase to both means is provided, and, since a high frequency is applied to the processing subject (the substrate) and the upper wall and the side wall, the phase of the high frequency which is applied to the respective high frequency applying means, the discharge between the substrate and the upper wall, the discharge between the substrate and the side wall, and the discharge between the upper wall and the side wall can be controlled.

As a result, by sputtering the adhesion matters extending over all faces of the inner wall of the plasma generating chamber, the cleaning of the inner wall of the vessel (the plasma generating chamber) can be carried out.

What is claimed is:

1. A plasma processing apparatus, comprising:
    a plasma generating chamber for generating a plasma in an interior portion thereof;
    a waveguide portion connected to said plasma generating chamber, for introducing microwave radiation which generates said plasma;
    a dielectric body arranged in said waveguide portion, for passing said microwave radiation and for contributing to maintaining said plasma generating chamber at a vacuum;
    a first permanent magnet enclosing an outer periphery of said waveguide portion, for providing an electron cyclotron resonance magnetic field at at least one portion of said waveguide portion and said plasma generating chamber, and for forming a cusp magnetic field in which an orientation of the cusp magnetic field is reversed along a transmission direction of said radiation;
    a plurality of second permanent magnets surrounding portions of said plasma generating chamber, said second permanent magnets arranged to have alternating polarities; and
    means for holding a processing subject to be plasma processed in said plasma generating chamber; wherein
    said dielectric body is arranged to intersect an entire electron cyclotron resonance area of said waveguide portion.

2. A plasma processing apparatus, comprising:
    a plasma generating chamber for generating a plasma in an interior portion thereof;
    a waveguide portion connected to said plasma generating chamber, for introducing microwave radiation which generates said plasma;
    a dielectric body arranged in said waveguide portion, for passing said microwave radiation and for contributing to maintaining said plasma generating chamber at a vacuum;
    a first permanent magnet enclosing an outer periphery of said waveguide portion, for providing an electron cyclotron resonance magnetic field at at least one portion of said waveguide portion and said plasma generating chamber, and for forming a cusp magnetic field in which an orientation of the cusp magnetic field is reversed along a transmission direction of said radiation;
    a plurality of second permanent magnets surrounding portions of said plasma generating chamber, said second permanent magnets arranged to have alternating polarities; and
    means for holding a processing subject to be plasma processed in said plasma generating chamber; wherein
    a tip end portion of said dielectric body at a side of said plasma generating chamber is positioned toward a side of said plasma generating chamber from an intermediate portion in an axial direction of said first permanent magnet.

3. A plasma processing apparatus, comprising:
    a plasma generating chamber for generating a plasma in an interior portion thereof;
    a waveguide portion connected to said plasma generating chamber, for introducing microwave radiation which generates said plasma;
    a dielectric body arranged in said waveguide portion, for passing said microwave radiation and for contributing to maintaining said plasma generating chamber at a vacuum;
    a first permanent magnet enclosing an outer periphery of said waveguide portion, for providing an electron cyclotron resonance magnetic field at least one portion of said waveguide portion and said plasma generating chamber, and for forming a cusp magnetic field in which an orientation of the cusp magnetic field is reversed along a transmission direction of said radiation;
    a plurality of second permanent magnets surrounding portions of said plasma generating chamber, said second permanent magnets arranged to have alternating polarities; and
    means for holding a processing subject to be plasma processed in said plasma generating chamber; wherein
    a tip end portion of said dielectric body at a side of said plasma generating chamber is substantially consistent with an inner face of said plasma generating chamber.

4. A plasma processing apparatus according to claim 3, wherein
said plasma generating chamber has a cylindrical form, and
a curvature of an inner face of said plasma generating chamber is substantially consistent with a curvature of a tip end portion of said dielectric body at a side of said plasma generating chamber.

5. A plasma processing apparatus, comprising:
a plasma generating chamber for generating a plasma in an interior portion thereof;
a waveguide portion connected to said plasma generating chamber, for introducing microwave radiation which generates said plasma;
a dielectric body arranged in said waveguide portion, for passing said microwave radiation and for contributing to maintaining said plasma generating chamber at a vacuum;
a first permanent magnet enclosing an outer periphery of said waveguide portion, for providing an electron cyclotron resonance magnetic field at at least one portion of said waveguide portion and said plasma generating chamber, and for forming a cusp magnetic field in which an orientation of the cusp magnetic field is reversed along a transmission direction of said radiation;
a plurality of second permanent magnets surrounding portions of said plasma generating chamber, said second permanent magnets arranged to have alternating polarities;
means for holding a processing subject to be plasma processed in said plasma generating chamber; wherein
said dielectric body is provided to intersect an entire electron cyclotron resonance area in said waveguide portion;
first means for applying a high frequency voltage to said processing subject;
second means for applying a high frequency voltage to an upper wall which serves as one portion of said plasma generating chamber; and
phase adjusting means for controlling a phase of each high frequency voltage applied by said first and second means for applying a high frequency voltage.

6. A plasma processing apparatus according to claim 5, wherein said plasma generating chamber has a side wall that is insulated electrically from said upper wall; said apparatus further comprising:
third means for applying a high frequency voltage to said side wall;
wherein said phase adjusting means varies a phase difference which is applied between said side wall and said upper wall, and a phase difference which is applied between said side wall and said processing subject.

7. In a plasma processing apparatus according to claim 6, further comprising:
an element in said waveguide portion, for passing said microwave radiation and for shielding high frequency voltage.

8. A plasma processing apparatus, comprising:
a plasma generating chamber for generating a plasma in an interior portion thereof;
a waveguide portion connected to said plasma generating chamber, for introducing microwave radiation which generates said plasma;
a dielectric body arranged in said waveguide portion, for passing said microwave radiation and for contributing to maintaining said plasma generating chamber at a vacuum;
a first permanent magnet enclosing an outer periphery of said waveguide portion, for providing an electron cyclotron resonance magnetic field at at least one portion of said waveguide portion and said plasma generating chamber, and for forming a cusp magnetic field in which an orientation of the cusp magnetic field is reversed along a transmission direction of said radiation;
a plurality of second permanent magnets surrounding portions of said plasma generating chamber, said second permanent magnets arranged to have alternating polarities; and
means for holding a processing subject to be plasma processed in said plasma generating chamber; wherein
said waveguide portion has a taper form which inclines to be gradually more narrow toward a proceeding direction of said microwave;
said first permanent magnet is arranged along said inclination of said waveguide portion;
a winding is provided at a periphery of said first permanent magnet; and
a tip end portion of said dielectric body at a side of said plasma generating chamber is substantially consistent with an inner face of said plasma generating chamber.

9. A plasma processing apparatus, comprising:
a plasma generating chamber for generating a plasma in an interior portion thereof;
a waveguide portion connected to said plasma generating chamber, for introducing microwave radiation which generates said plasma;
a dielectric body arranged in said waveguide portion, for passing said microwave radiation and for contributing to maintaining said plasma generating chamber at a vacuum;
a first permanent magnet enclosing an outer periphery of said waveguide portion, for providing an electron cyclotron resonance magnetic field at at least one portion of said waveguide portion and said plasma generating chamber, and for forming a cusp magnetic field in which an orientation of the cusp magnetic field is reversed along a transmission direction of said radiation;
a plurality of second permanent magnets surrounding portions of said plasma generating chamber, said second permanent magnets arranged to have alternating polarities;
means for holding a processing subject to be plasma processed in said plasma generating chamber; wherein
said dielectric body is arranged to be substantially consistent with an inner face of said plasma generating chamber;
first means for applying a high frequency voltage to said processing subject;
second means for applying a high frequency voltage to an upper wall which serves as one portion of said plasma generating chamber; and
means for controlling a phase of each high frequency voltage applied by said first and second means for applying a high frequency voltage.

* * * * *